United States Patent
Hirayasu

(10) Patent No.: US 6,519,450 B2
(45) Date of Patent: *Feb. 11, 2003

(54) RADIO BROADCASTING RECEIVER

(75) Inventor: Masatoshi Hirayasu, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/356,793

(22) Filed: Jul. 20, 1999

(65) Prior Publication Data

US 2001/0044285 A1 Nov. 22, 2001

(30) Foreign Application Priority Data

Jul. 28, 1998 (JP) .......................... P10-212924

(51) Int. Cl.⁷ ................................ H04B 1/06
(52) U.S. Cl. ................. 455/245.1; 455/226.1; 455/234.1
(58) Field of Search .................. 455/226.1–226.2, 455/232.1, 234.2, 234.1–240.1, 245.1, 267, 130, 161.1, 161.3, 186.1; 375/345

(56) References Cited

U.S. PATENT DOCUMENTS

| | | | | |
|---|---|---|---|---|
| 3,936,599 A | * | 2/1976 | Peil et al. .............. 178/7.3 DC |
| 4,987,605 A | * | 1/1991 | Nose ........................ 455/161 |
| 5,390,344 A | * | 2/1995 | Nagata ...................... 455/220 |
| 5,400,365 A | * | 3/1995 | Tulai .......................... 375/88 |
| 5,451,839 A | * | 9/1995 | Rappaport et al. .......... 375/224 |
| 5,471,662 A | * | 11/1995 | Shiota ..................... 455/166.1 |
| 5,570,093 A | * | 10/1996 | Aker et al. ................. 342/104 |
| 5,706,357 A | | 1/1998 | Yang ......................... 381/107 |
| 5,842,119 A | * | 11/1998 | Emerson et al. ......... 455/161.3 |
| 5,917,865 A | * | 6/1999 | Kopmeiners et al. ....... 375/345 |
| 5,923,288 A | * | 7/1999 | Pedlow, Jr. ................ 342/359 |
| 5,987,099 A | * | 11/1999 | O'Neill et al. ............... 379/60 |
| 5,995,816 A | * | 11/1999 | Grayson et al. ......... 455/246.1 |
| 6,131,031 A | * | 10/2000 | Lober et al. ................ 455/444 |

OTHER PUBLICATIONS

Patent Abstracts of Japan, vol. 1998, No. 10, Aug. 31, 1998 & JP 10 135856 A (Fujitsu Ten LTD.) May 22, 1998.

* cited by examiner

Primary Examiner—Thanh Cong Le
Assistant Examiner—C. Chow
(74) Attorney, Agent, or Firm—Oblon, Spivak, McClelland, Maier & Neustadt, P.C.

(57) ABSTRACT

A radio broadcasting receiver having auto tuning process a digital signal processor includes a process for detecting a maximum value of a received signal output for each of a plurality of broadcasting stations selected during station selection, storage means for storing a detected maximum value of received signal output of each of the broadcasting stations, process for calculating a mean value of a plurality of stored maximum values of received signal outputs, and a process for calculating an output gain on the basis of a maximum value of a received signal output of a broadcasting station to be received and the mean value, and there is provided a process for conducting a gain control upon station selection according to an output of the digital signal processor so as to instantaneously bring the received signal output closer to the mean value, and which conducts automatically a sound volume adjustment at the time of station selection.

12 Claims, 3 Drawing Sheets

RADIO BROADCASTING RECEIVER

BACKGROUND OF THE INVENTION

1. Field of the Invention

The present invention relates to an AM receiver and an FM receiver to be mounted on a vehicle. In particular, the present invention relates to a radio receiver which reduces differences in an audio signal output based upon differences in degree of modulation among different broadcasting stations when an FM broadcast is received.

2. Description of the Related Art

Heretofore, FM receivers have been used as radio broadcasting receivers mounted on vehicles. On a transmitting side, a frequency of a carrier wave is modulated by a modulation signal and transmitted. The transmitted signal is received on a receiving side. The frequency modulated signal is converted to an amplitude modulated signal. Furthermore, the amplitude modulated signal is demodulated and outputted as an audio signal. Due to differences in degree of modulation among different broadcasting stations, the output level sometimes changes whenever a station was selected.

In the case where the degree of modulation is significantly different among respective broadcasting stations, the tone level is markedly changed in conventional radio broadcasting receivers whenever a station is selected, as described above. Each time, a sound volume adjustment is needed. In the case of an appliance mounted on a vehicle, however, it is an immense work for a driver to conduct the sound volume adjustment each time. Furthermore, if the gain of the receiver is continuously controlled for the sound volume adjustment, there is sometimes a feeling of fluttering in sound.

SUMMARY OF THE INVENTION

An object of the present invention is to provide a radio broadcasting receiver to be mounted on a vehicle, which overcomes the above described drawbacks of the conventional radio broadcasting receiver mounted on a vehicle, which automatically conducts sound volume adjustment when a station is selected, and which can receive nearly the same sound volume irrespective of the station selected.

According to an aspect of the present invention, there is provided a radio broadcasting receiver having an auto tuning means and a digital signal processor, wherein the digital signal processor include a detection means for detecting a maximum value of a received signal output for each of a plurality of broadcasting stations selected during station selection, a storage means for storing a detected maximum value of a received signal output of each of the broadcasting stations, a computation means for calculating a mean value of a plurality of stored maximum values of received signal outputs, and a means for calculating an output gain on the basis of a maximum value of a received signal output of a broadcasting station to be received and the mean value, and wherein there is provided a means for conducting a gain control upon station selection according to an output of the digital signal processor so as to instantaneously bring the received signal output closer to the mean value.

In the above described radio broadcasting receiver, the mean value can be calculated for only a selected broadcasting station among receivable broadcasting stations as the plurality of broadcasting stations. If a selected broadcasting station has newly joined, the mean value can be recalculated.

In the above described radio broadcasting receiver, the storage means can update the storage of the plurality of maximum values of received signal outputs as occasion demands, and the update time can be freely set by a designer on the basis of results of field tests.

DESCRIPTION OF THE PREFERRED EMBODIMENT

Hereafter, a radio broadcasting receiver which is an embodiment of the present invention will be described in reference to the accompanying drawing.

Figure 1:
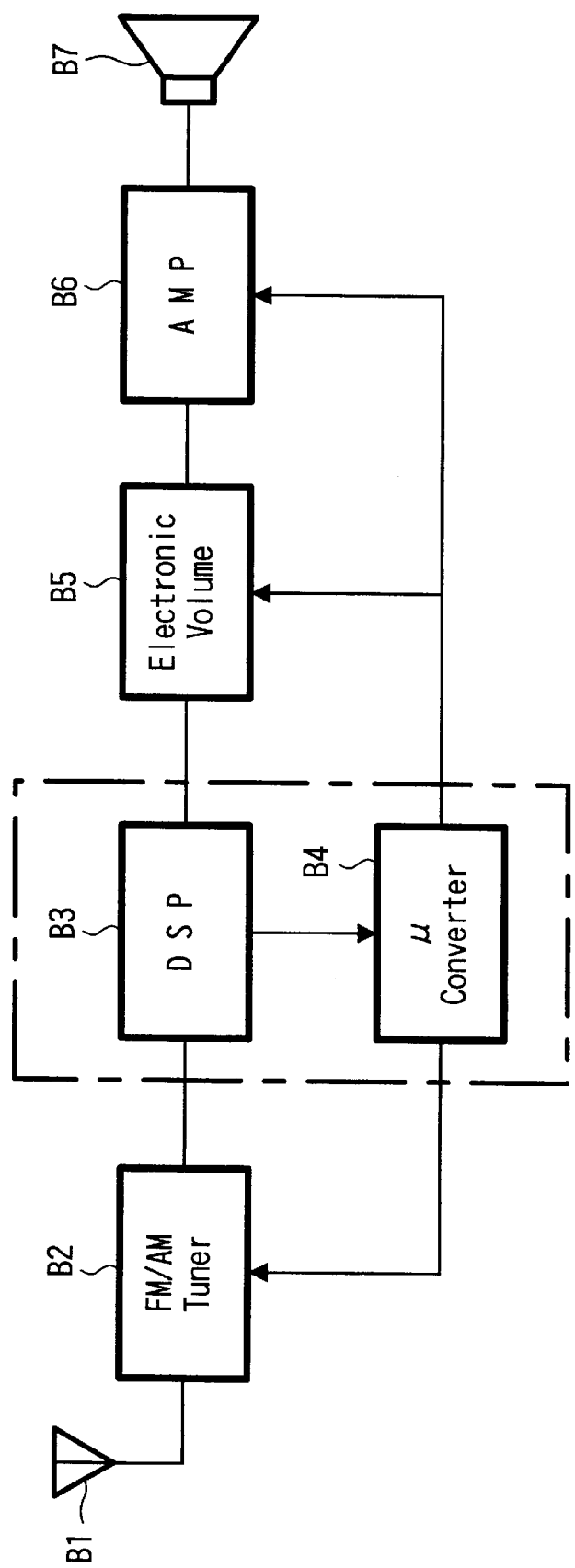
FIG. 1 is a system configuration diagram of an embodiment of a vehicle-mounted radio broadcasting receiver according to the present invention.

As shown in FIG. 1, a radio broadcasting receiver which is an embodiment of the present invention includes an antenna B1, an FM or AM tuner B2, a DSP (digital signal processor) B3, a $\mu$ converter (gain converter) B4, an electronic volume B5, an amplifier B6, and a speaker B7.

Among signals received by the antenna B1, only one station is selected by the FM/AM tuner B2 and its signal is sent to the DSP B3. An output of the DSP circuit B3 is sent to the speaker B7 via the electronic volume B5 and the amplifier B6, and outputted as a sound.

On the other hand, a gain control signal obtained as a result of calculation conducted in the DSP B3 is sent to the $\mu$ (gain) converter B4, and used to control the gain of the receiver.

Figure 2:
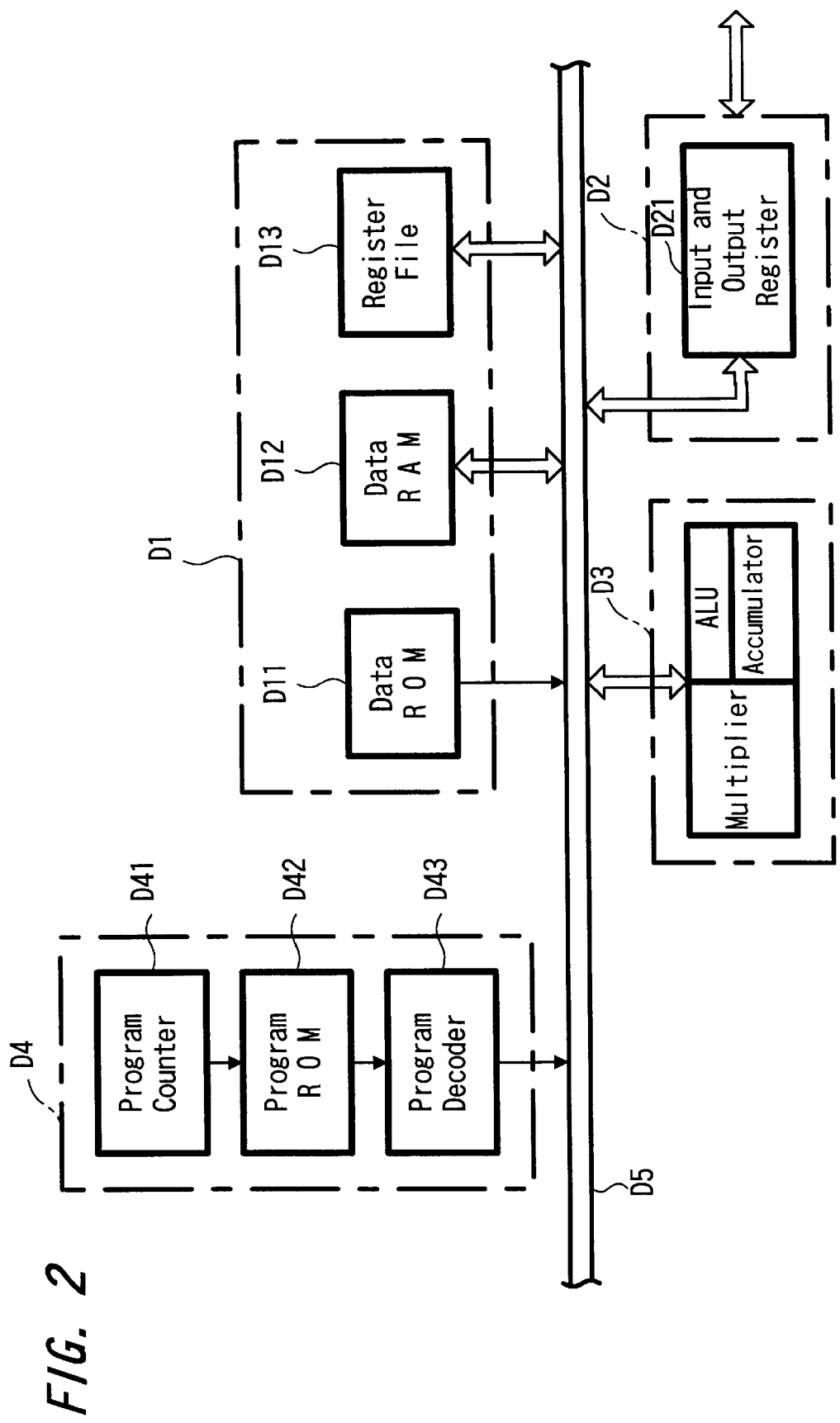
FIG. 2 is a system configuration diagram of a DSP (digital signal processor)

The DSP (B3) shown in FIG. 1 is arranged, for example, as shown in FIG. 2. In other words, FIG. 2 shows the system configuration of a general purpose DSP. The DSP includes a data memory section D1, an input and output section D2, a computation unit D3, a decoder section D4, and a data bus D5.

An audio output signal taken out from the FM/AM tuner B2 of FIG. 1 is converted to a digital signal by an A-D converter (not illustrated), and stored in a data RAM (D12) of the data memory section D1 via the input and output section D2 in FIG. 2. In the data memory section D1, a data ROM (D11) is provided. It is possible to calculate and store a mean value of received audio output signals for a plurality of receivable broadcasting stations beforehand.

If the sound volume of the received signal of a newly selected station is too large or too small as compared with the mean sound volume and sound volume, adjustment is necessary, then this is sensed by conducting calculation in the computation section D3 on the basis of data stored in the data RAM and data read out from the data ROM and a correction value is calculated. A result is stored in the data ROM (D12), and sent to a control section of the receiver via the input and output section D2. In FIG. 1, this control section is represented as the $\mu$ converter B4.

Operations in the system of FIG. 2, such as data storage, data transfer, computation control and so on, are conducted in accordance with a program stored in the decoder D4. Moreover, the decoder section D4 includes a program counter D41 for controlling a program readout, a program ROM (D42) having a program to be executed written thereon, and a program decoder D43 for converting the program read out to an actual control command.

Functions of the DSP (digital signal processor) shown in FIG. 2 in the present embodiment are as follows.

a. A maximum value of an inputted audio signal is stored in the data RAM as the received signal level of a selected station at that time. For example, if an inputted signal range is 0000h to 8FFFh, then the audio signal inputted is represented as 5EF0h or the like.

b. It is made externally controllable by means of a software whether or not the maximum value of the inputted audio signal should be maintained as the audio signal level.

c. It is made possible to freely set the time during which the maximum value is maintained. In other words, the maximum value of the input audio signal is maintained during the set time, and the maximum value is reset when the set time has elapsed.

d. It is made possible to read out the maximum value during the holding time as data according to an external request.

e. The gain of the audio signal outputted from this DSP is defined as:

(output gain)=(set value/maximum value).

Calculation of the set value will now be described.

It is now assumed that the number of receivable broadcasting stations is 6 and the stations are referred to as BCS1 through BCS6. First of all, with regard to an arbitrary station BCS1, data of a maximum value of an audio signal in a constant time, such as 5 minutes, is stored. Subsequently, another arbitrary station BCS2 is selected, and data of maximum value of an audio signal in the constant time is stored in the same manner. Hereafter, data of maximum values are stored for all the six stations in the same manner.

After the maximum values of the received audio signal levels have been stored for all stations, a mean value of the maximum values of those six stations is calculated. In other words, representing the mean value by Mm, and the maximum values of the six stations BCS1, BCS2, . . . , BCS6 by Mx1, Mx2, . . . , Mx6, the following equation is obtained.

$$Mm=(Mx1+Mx2+ \ldots +Mx6)/6$$

This value Mm is the above described set value.

A sound volume adjustment conducted when a certain station BCS2 has been selected will now be described.

If the number of receivable broadcasting stations is six as described above, then the mean value of the maximum values of received signal outputs of the six station is Mm, and the maximum value of the received signal output of the station BCS2 which is now being received is Mx2. Therefore, it is sufficient that the gain of the receiver is set to G=Mm/Mx2. By doing so, the received signal output becomes Mx2 Mm/Mx2=Mm, and output of the mean level can be obtained.

As for the above described mean value (i.e., set value), it is not always necessary to conduct detection for all receivable stations and calculate the mean value of them. At a certain time point, a mean value may be calculated by regarding all stations selected until then as all stations. If the number of selected stations has increased, the mean value may be recalculated.

The reason why the received signal output is averaged when the above described method is used will now be described. For brevity of description, it is now assumed that receivable stations are two stations, BCS1 and BCS2 (Here, "receivable stations" refer to stations from which broadcasting is usually received. Therefore, they can be also expressed as reception desired stations. Either way, it is irrelevant to whether reception is physically possible or impossible).

Assuming now that the audio output signal maximum value is 10 when a broadcast of the broadcasting station BCS1 is received and the audio output signal maximum value is 14 when broadcasting of the broadcasting station BCS2 is received, the above described set value Mm can be derived as a mean value of these values by the following equation.

$$Mm=(10+14)/2=12$$

When a broadcast of the broadcasting station BCS2 is received, the output gain of the receiver is Mm/Mx2. Therefore, the receiver output becomes 14×(12/14)=12.

If at this time a broadcast of the broadcasting station BCS1 is received, then the output becomes 10×(12/10)=12. Therefore, the received signal levels become the same.

Heretofore, the case where the number of receivable stations is two has been described. Also in the case where the number of receivable stations is increased to three, four, and so on, however, the sound volume adjustment can be conducted in the same manner. Furthermore, the sound volume adjustment can be applied to an arbitrary number of stations. As that time, the adjusted audio output becomes the set value Mm.

Figure 3:
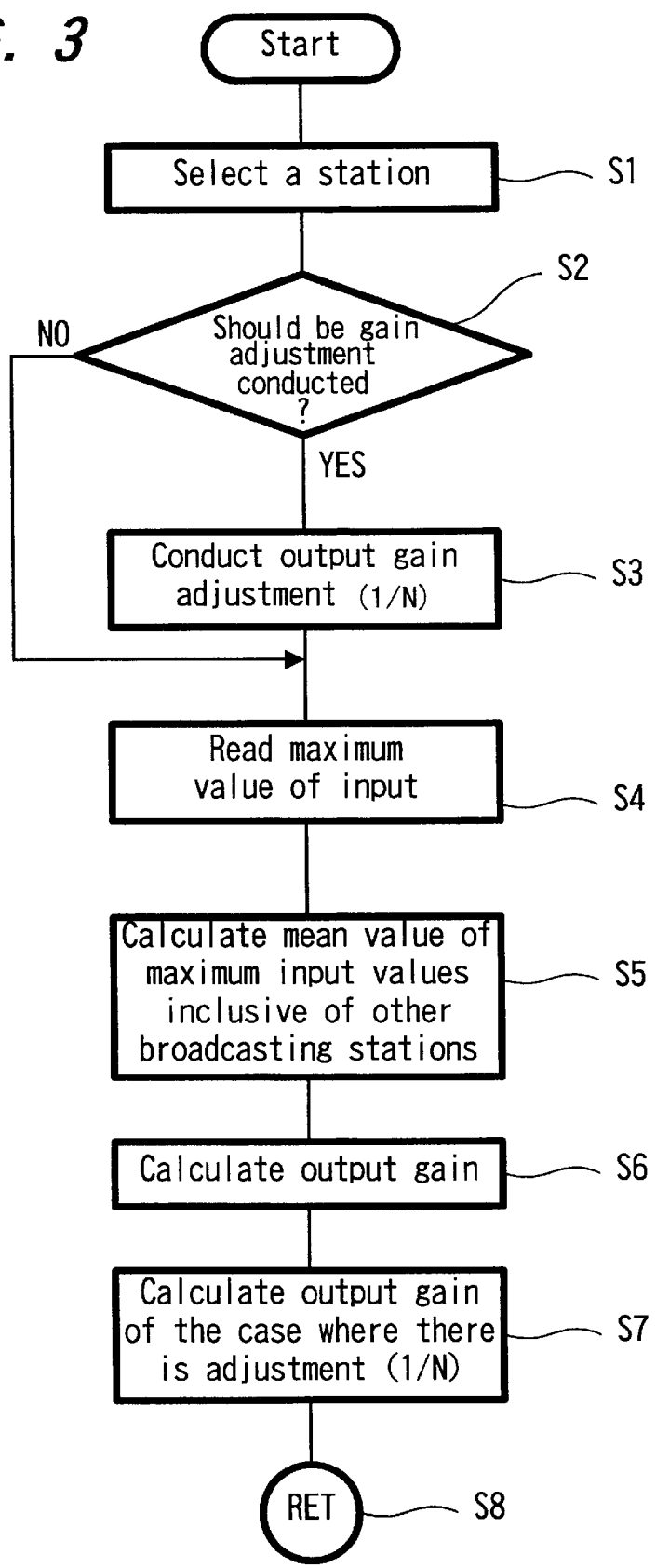
FIG. 3 is an operation flow chart of a vehicle-mounted radio broadcasting receiver according to the present invention.

Gain adjusting operation will now be described by referring to FIG. 3.

At step S1, station selection is conducted. A station which is desired to be received is selected, and its broadcast is received.

The processing proceeds to step S2, and it is determined whether or not gain adjustment of the received signal output is necessary. If the gain adjustment is necessary, then the processing proceeds to step S3, and the output adjustment is conducted. For example, the output gain is adjusted to become 1/n. After the output gain adjustment, the processing proceeds to step S4. If it is determined at the step S2 that the gain adjustment is unnecessary, the processing proceeds directly to the step S4.

At step S4, a maximum value Mx of received signal output of the broadcasting station now selected is read and stored in the memory. Then, the processing proceeds to step S5. At step S5, maximum values of received output signals of other broadcasting stations already stored are read out, and a mean value of those maximum values is calculated. This value is determined to be a reference value for the output gain calculation (set value Mm in the foregoing description).

Upon termination of the step S5, the processing proceeds to step S6, and the output gain Mm/Mx is calculated. In succession, the processing proceeds to step S7, and gain calculation is conducted. If the output gain is adjusted to become 1/n at step S3, the gain adjustment value to be outputted here is also made to become 1/n. Then the processing proceeds to step S8, and the processing is finished.

When broadcasting stations are selected one after another and a signal reception is conducted at a station desired in reception by using an auto tuning or the like, the radio broadcasting receiver of the present invention conducts the sound volume adjustment automatically by using the DSP (digital signal processor). As a result, unevenness in output sound volume among selected different broadcasting stations is eliminated.

The gain for the volume adjustment is decided by calculation on the basis of a mean value of received signal outputs of a plurality of stations. Since at this time it is not necessary to use received signal outputs of all broadcasting stations in order to derive the mean value, the mean value can be calculated as the occasion may demand.

Data used to derive the mean value serving as the reference value for sound volume adjustment can be updated as occasion demands. This update can be implemented simply by a software.

Having described a preferred embodiment of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A radio broadcasting receiver, comprising:
   a digital signal processor, the digital signal processor including,
      detection means for detecting a maximum value of a received signal output for each of a plurality of broadcasting stations selected during station selection,
      storage control means for storing each detected maximum value as one of a plurality of stored maximum values in a storage means and for retrieving said plurality of stored maximum values from said storage means,
      computation means for calculating a mean value of said plurality of stored maximum values retrieved by said storage control means, and
      means for calculating an output gain on the basis of a maximum value of a received signal output of a broadcasting station to be received and the mean value; and
   means for performing gain control upon station selection according to an output of the digital signal processor to bring a received signal output closer to the mean value.

2. The receiver of claim 1, wherein the plurality of broadcasting stations includes only selected broadcasting stations among receivable broadcasting stations and the mean value is calculated for said selected broadcasting stations, and wherein when a new receivable broadcasting station is added to the selected broadcasting stations, the mean value is recalculated.

3. The receiver of claim 1, wherein the storage control means is configured to update the storage of the plurality of stored maximum values in the storage means at an update time set by a user.

4. The receiver of claim 2, wherein the storage control means is configured to update the storage of the plurality of stored maximum values in the storage means at an update time set by a user.

5. A radio broadcasting receiver, comprising:
   a digital signal processor, the digital signal processor including,
      a detector configured to detect a maximum value of a received signal output for each of a plurality of broadcasting stations selected during station selection,
      a memory controller configured to store each detected maximum value as one of a plurality of stored maximum values in a memory and to retrieve said plurality of stored maximum values from said memory,
      a computation unit configured to calculate a mean value of said plurality of stored maximum values retrieved by said memory controller, and
      an output gain generator configured to determine an output gain on the basis of a maximum value of a received signal output of a broadcasting station to be received and the mean value; and
   a gain controller configured to perform gain control upon station selection according to an output of the digital signal processor to bring a received signal output closer to the mean value.

6. The receiver of claim 5 wherein the plurality of broadcasting stations includes only selected broadcasting stations among receivable broadcasting stations and the mean value is calculated for the selected broadcasting stations, and wherein when a new receivable broadcasting station is added to the selected broadcasting stations, the mean value is recalculated.

7. The receiver of claim 6 wherein the memory controller is configured to update the storage of the plurality of stored maximum values in the storage means at an update time set by a user.

8. The receiver of claim 5 wherein the memory controller is configured to update the storage of the plurality of stored maximum values in the storage means at an update time set by a user.

9. A method of providing a radio broadcasting receiver, comprising the steps of:
   detecting a maximum value of a received signal output for each of a plurality of broadcasting stations selected during station selection;
   storing each detected maximum value as one of a plurality of stored maximum values;
   retrieving said plurality of stored maximum values;
   calculating a mean value of said plurality of stored maximum values using the retrieved plurality of said stored maximum values;
   determining an output gain on the basis of a maximum value of a received signal output from a broadcasting station to be received and the mean value; and
   performing gain control upon station selection so as to bring a received signal output closer to the mean value.

10. The method of claim 9 wherein the plurality of broadcasting stations includes only selected broadcasting stations among receivable broadcasting stations and the mean value is calculated for the selected broadcasting stations, and further including the step of recalculating the mean value when a new one of the receivable broadcasting stations is added to the selected broadcasting stations.

11. The method of claim 10 wherein the step of storing includes the step of updating the storage of the plurality of maximum values of received signal outputs as occasion demands, and the update time can be freely set by a user.

12. The method of claim 9 wherein the step of storing includes the step of updating the storage of the plurality of maximum values of received signal outputs as occasion demands, and the update time can be freely set by a user.

* * * * *